(12) United States Patent
Hacker et al.

(10) Patent No.: US 7,712,922 B2
(45) Date of Patent: May 11, 2010

(54) ILLUMINATION UNIT COMPRISING AN LED LIGHT SOURCE

(75) Inventors: Christian Hacker, Treviso (IT); Giovanni Scilla, Fontane di Villorba (IT); Alessandro Scordino, Mestre (IT); Jens Florian Hockel, Munich (DE); Philipp Erhard, Mehring (DE); Fritz Hereth, Puchheim (DE)

(73) Assignee: OSRAM Gesellschaft mit beschränkter Haftung, München (DE)

( * ) Notice: Subject to any disclaimer, the term of this patent is extended or adjusted under 35 U.S.C. 154(b) by 159 days.

(21) Appl. No.: 11/986,965

(22) Filed: Nov. 26, 2007

(65) Prior Publication Data

US 2008/0175019 A1      Jul. 24, 2008

(30) Foreign Application Priority Data

Nov. 24, 2006  (DE) ............... 20 2006 017 924 U

(51) Int. Cl.
    *F21V 14/00*    (2006.01)
(52) U.S. Cl. ............ 362/256; 362/191; 362/249.02; 362/249.11; 362/311.01; 362/311.02

(58) Field of Classification Search ........... 362/252, 362/253, 191, 249, 364, 294, 373, 646, 555, 362/800, 434, 227, 240, 249.02, 249.11, 362/311.01, 311.02, 255, 256; 257/79, 98, 257/99, 675

See application file for complete search history.

(56) References Cited

U.S. PATENT DOCUMENTS

| 6,787,999 | B2 * | 9/2004 | Stimac et al. ............ 315/51 |
| 7,078,732 | B1 | 7/2006 | Reeh et al. |
| 7,488,097 | B2 * | 2/2009 | Reisenauer et al. ......... 362/373 |

FOREIGN PATENT DOCUMENTS

| DE | 102005019375 | 9/2006 |
| WO | WO 97/50132 | 12/1997 |

* cited by examiner

*Primary Examiner*—Jacob Y Choi
(74) *Attorney, Agent, or Firm*—Cohen Pontani Lieberman & Pavane LLP

(57) ABSTRACT

An illumination unit comprising an LED light source is disclosed, which has a first optical element disposed downstream of the LED light source in an emission direction, an electronic control unit, and a second optical element disposed downstream of the first optical element. The LED light source, the first optical element and the electronic control unit are arranged in a common housing, and the housing is covered by the second optical element.

12 Claims, 5 Drawing Sheets

ILLUMINATION UNIT COMPRISING AN LED LIGHT SOURCE

RELATED APPLICATIONS

Figure 1:
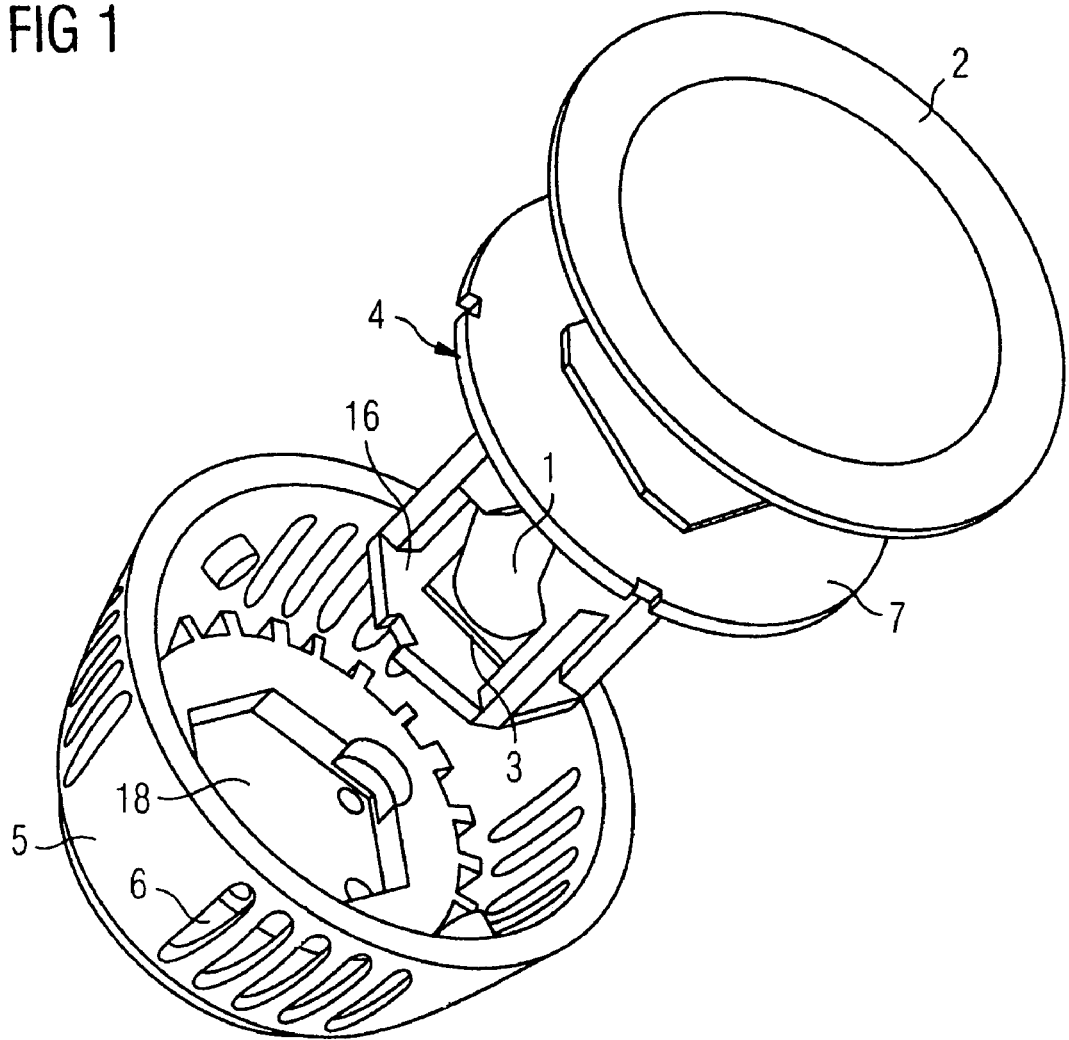

This patent application claims the priority of German Utility Model Application 202006017924.0 filed Nov. 24, 2006, the disclosure content of which is hereby incorporated by reference.

FIELD OF THE INVENTION

The invention relates to an illumination unit comprising an LED light source.

BACKGROUND OF THE INVENTION

LED light sources are distinguished by a high efficiency, a long lifetime, a fast response time and a comparatively low sensitivity to impacts and vibrations. For this reason, LED light sources can be used in illumination units in which incandescent lamps have often been used heretofore, in particular in luminaires for general lighting or in motor vehicle headlights. On account of their high luminosity, LED light sources are now also suitable for use in traffic signal systems or projection light sources.

In order to obtain a desired emission characteristic, LED light sources often involve the use of optical elements specifically coordinated with the LED light source. By way of example, the document DE 102005019375 A1 discloses an LED array in which a respective beam shaping element in the form of an optical concentrator is disposed downstream of a plurality of LED chips arranged on a common carrier.

For the use of such LED light sources for illumination purposes, in particular in luminaires for general lighting which are produced in large numbers, it is desirable to integrate the LED light source with the associated optical and electronic components into a compact overall system which is protected against environmental influences, in particular dirt, moisture or mechanical damage.

One object of the invention is to provide an improved illumination unit comprising an LED light source which has optical components provided for beam shaping, in particular, and is fitted with an electronic control unit into a compact housing which affords protection against external influences.

An illumination unit according to an embodiment of the invention contains an LED light source, a first optical element disposed downstream of the LED light source in an emission direction, an electronic control unit, and a second optical element disposed downstream of the first optical element, wherein the LED light source, the first optical element and the electronic control unit are arranged in a common housing, and the housing is covered by the second optical element.

Therefore, besides the LED light source, at least a first and a second optical element for beam shaping of the radiation emitted by the LED light source and also an electronic control unit are integrated into the housing of the illumination unit. Besides its optical function, the second optical element advantageously simultaneously functions as a covering of the housing. The illumination unit is thus distinguished by a compact design.

The housing is preferably a metal housing. A high mechanical stability of the housing and a good heat dissipation of the heat emitted by the LED light source are obtained in this way.

The housing of the illumination unit preferably has lateral openings in order, in particular, to improve the dissipation of the heat generated by the LED light source. By way of example, a side wall of the housing can contain between 15 and 25 openings inclusive.

In one preferred embodiment of the invention, the lateral openings of the housing serve not only for heat dissipation of the heat generated by the LED light source, but at the same time also for fixing the second optical element to the housing. In particular, fixing elements which latch in lateral openings of the housing can be provided at the second optical element. Moreover, in addition to the openings provided for heat dissipation, it is also possible to form further openings for fixing the second optical element in the side wall of the housing. Furthermore, it is also possible for the fixing elements of the second optical element to latch into a cutout at the inner wall of the housing. In this case, the fixing elements are advantageously not visible from the outside. The second optical element, which simultaneously constitutes the housing covering, is therefore advantageously connected to the housing without screw or adhesive bonding connections and can thus be connected to the housing or separated from the housing in a comparatively simple manner.

The electronic control unit for the LED light source is preferably arranged on a circuit board mounted in the housing. In particular, the electronic control unit can be applied to a printed circuit board (PCB).

The circuit board of the electronic control unit preferably has a cutout through which the radiation emitted by the LED light source passes. The cutout can be arranged in particular in the centre of the circuit board. In this way, the circuit board can advantageously be arranged in a space-saving manner above the LED light source as seen in the emission direction. In particular, it is not necessary in this case to fit the electronic control unit together with the LED light source on a base area of the housing opposite the housing covering. The base area of the housing can therefore be advantageously reduced in this way.

The electronic components of the electronic control unit are preferably arranged on a side of the circuit board which is remote from the second optical element. This has the advantage that the electronic components are not visible when viewing the illumination unit through the housing covering formed by the second optical element. Rather, that surface of the circuit board which faces the second optical element is preferably free of electronic components and can be adapted in terms of colour to the light emitted by the LED light source, for example white light.

For positioning and fixing the circuit board in the housing, at least one positioning and fixing element for the circuit board is formed at an inner wall of the housing. In particular, a clamping device can be provided at an inner wall of the housing in order to fix the circuit board in the housing in a comparatively simple manner.

The circuit board can adjoin an inner wall of the housing, in particular, that is to say that the outer contour of the circuit board is preferably adapted to the housing. By way of example, the housing can be a round housing, the external diameter of the circuit board matching an internal diameter of the housing.

Cutouts for the fixing elements of the second optical element are preferably formed at an edge of the circuit board which faces the housing. In particular, the second optical element can have snap-action feet which are led through the cutout of the circuit board to the lateral openings of the housing, where they latch in place for fixing the second optical element. In this way, the housing, the circuit board and the second optical element are advantageously mechanically connected to one another without adhesive bonding connection or screw connection, and, in particular, cannot be rotated with respect to one another relative to a principal axis of the housing.

The second optical element is preferably a lens. The lens is preferably curved convexly at the surface remote from the LED light source.

In one preferred embodiment of the invention, the lens has a surface structure composed of cushion-type elevations at the surface facing the LED light source. The cushion-type elevations can have for example an ellipsoidal or spherical convex curvature. The base area of the cushion-type elevations is preferably a polygonal area, in particular a hexagonal or octagonal area.

The cushion-type surface structure facing the LED light source acts as a diffuser for the light emitted by the LED light source, while the convexly curved surface of the second optical element opposite the cushion-type elevations serves for collimating the diffuse light bundle generated in this way. In particular the colour homogeneity of the emitted light is improved in this way. This is advantageous in particular when the LED light source contains at least one LED chip which emits blue or ultraviolet light which is converted into white light by means of a luminescence conversion layer. This principle of generating white light is based on the fact that part of the blue or ultraviolet light emitted by the LED light source is converted into light of a complementary colour having a higher wavelength, for example yellow light, by the luminescence conversion materials, with the result that the complementary colours are superimposed on one another to form white light. Depending on the arrangement of the LED chips and the conversion material, however, it can happen here that the superimposition of the two complementary colour components is not completely homogeneous spatially and, consequently, for example the blue colour component of the LEDs and/or the complementary colour generated by means of luminescence conversion becomes visible to an observer. Undesirable colour deviations of this type are reduced by the diffuser formed by the cushion-type surface structure produced on the inner side of the second optical element.

In one preferred embodiment of the invention, the LED light source contains a plurality of LED chips. In particular, the plurality of LED chips can be arranged on a common carrier, for example in the form of an LED array.

In one preferred embodiment of the invention, the first optical element is an optical concentrator, in particular a compound parabolic concentrator (CPC). The optical concentrator advantageously reduces the beam divergence of the LED light source before the radiation impinges on the second optical element.

In a further advantageous configuration, the housing has a housing base fitting with an integrated heat sink. This improves the heat dissipation from the LED light source.

The housing base fitting is preferably a housing base fitting having standardized dimensions, for example a housing base fitting of the GU 5.3 type. Such a standardized housing base fitting is known per se and is used for example in the case of low-voltage halogen light sources. By means of such a housing base fitting, the LED illumination unit according to the invention can be integrated into existing luminaire systems in a simple manner.

BRIEF DESCRIPTION OF TILE DRAWINGS

Figure 2:
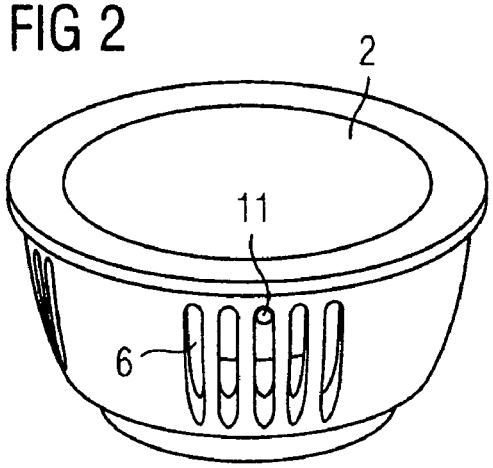
Figure 3:
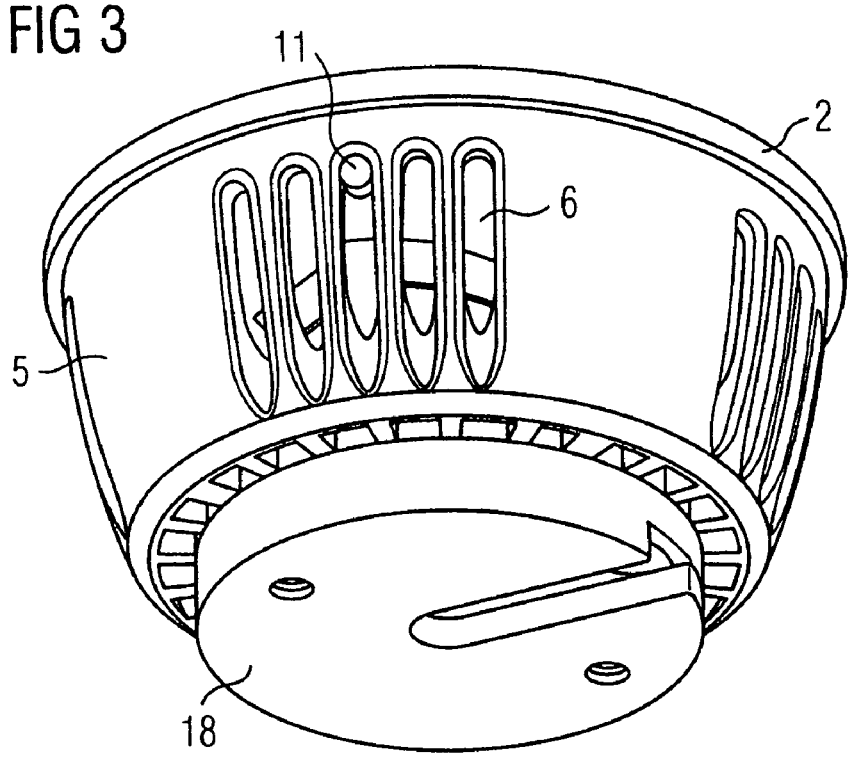
Figure 4:
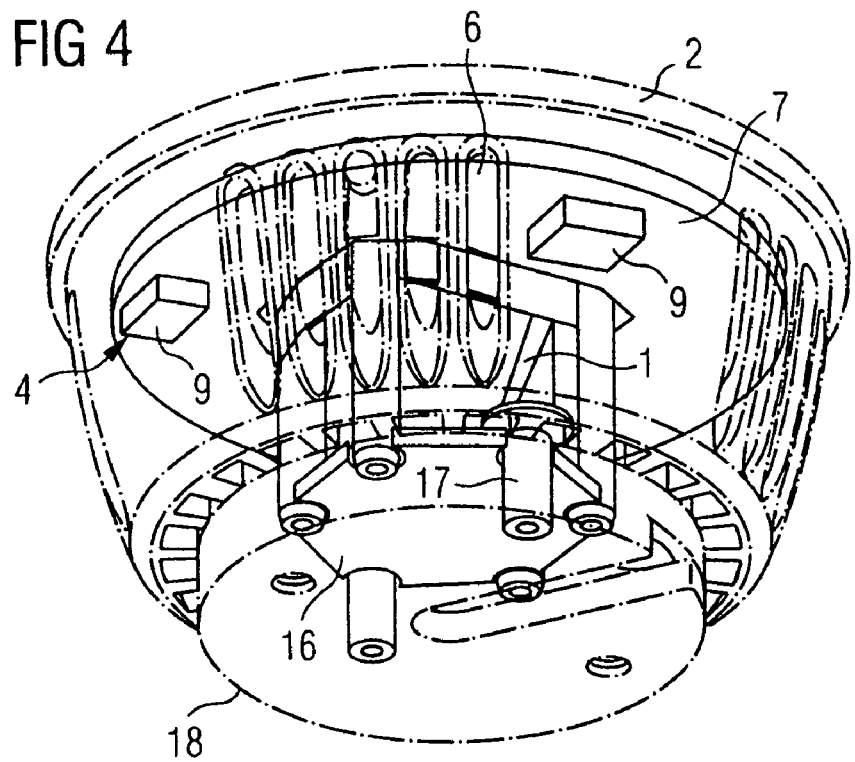
Figure 5:
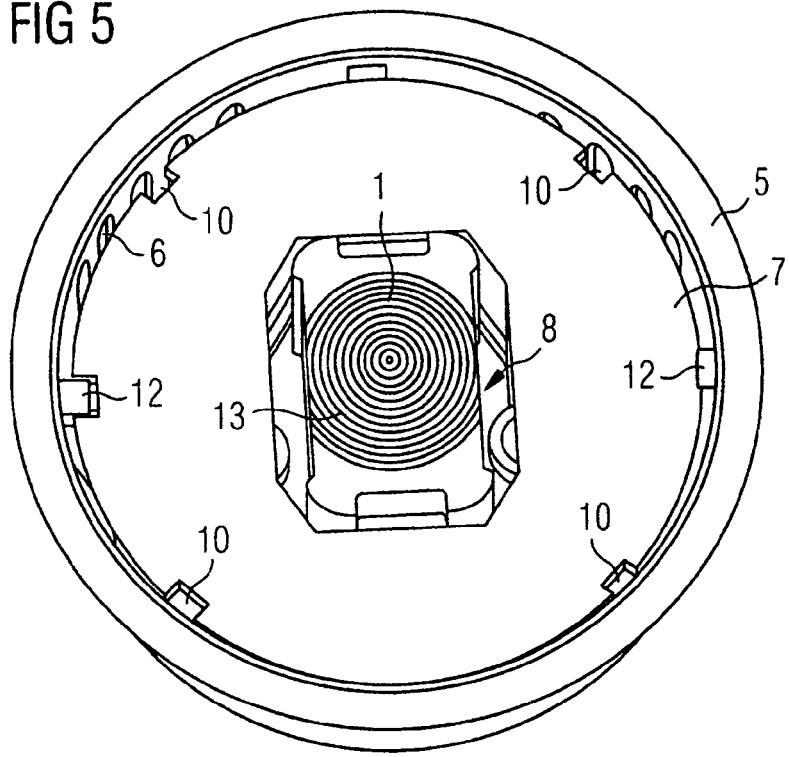
Figure 6:
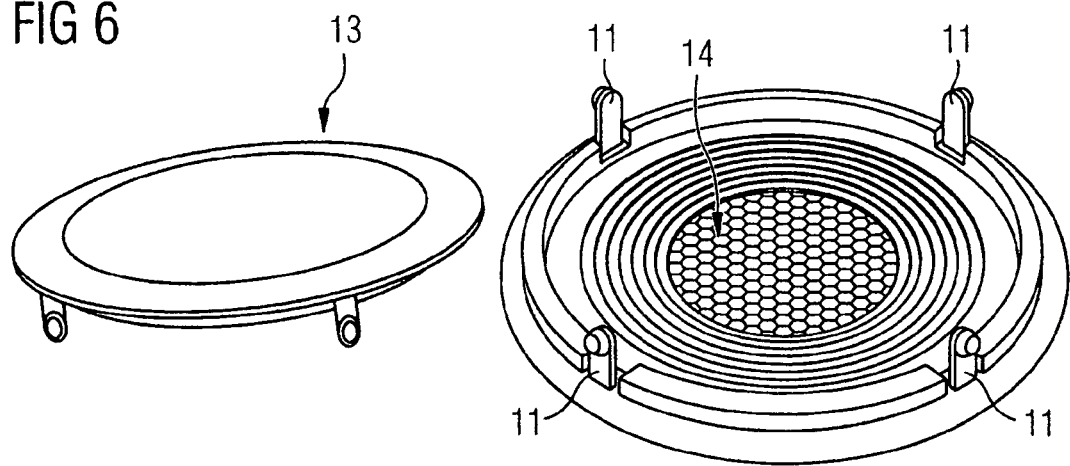
Figure 7:
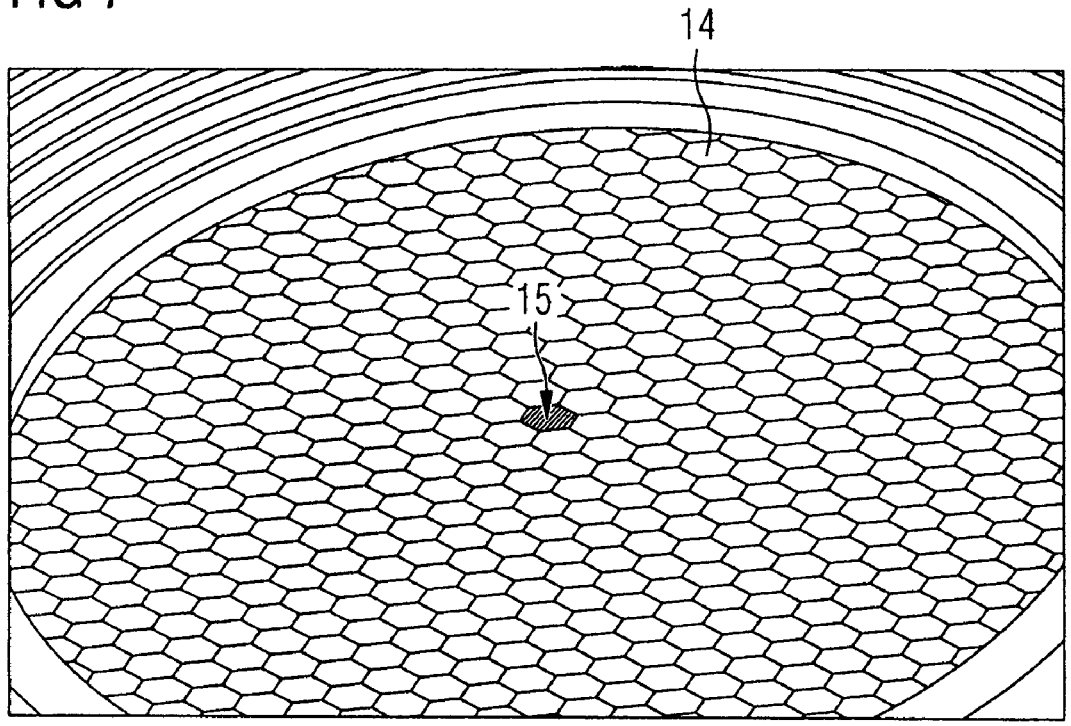
Figure 8:
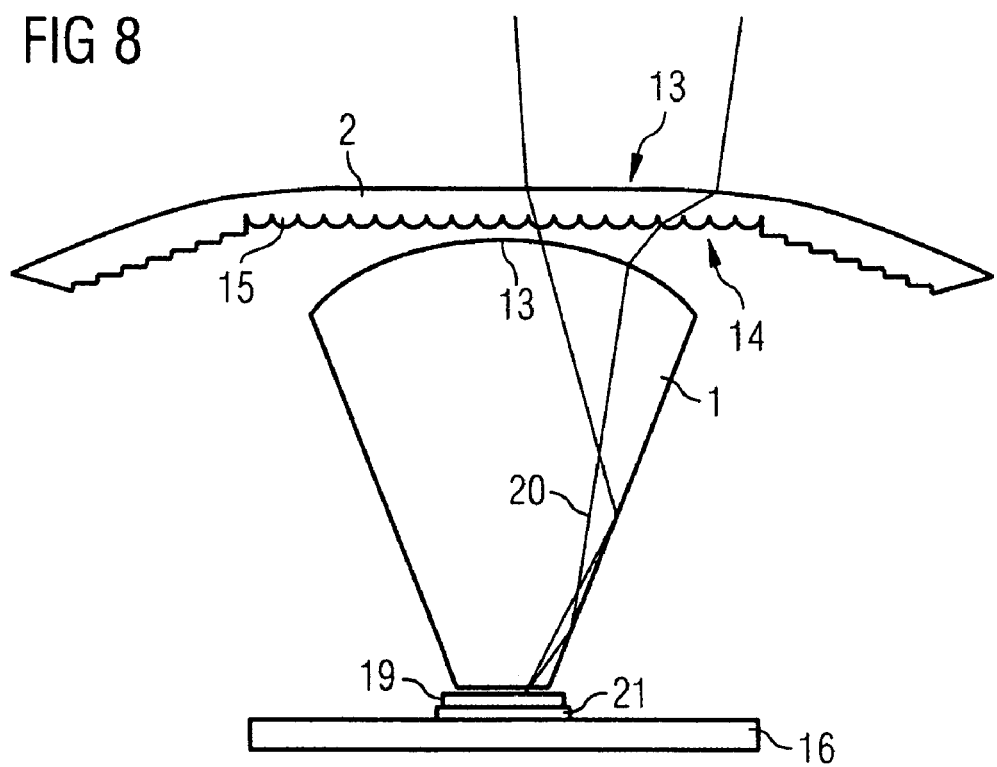
Figure 9A:
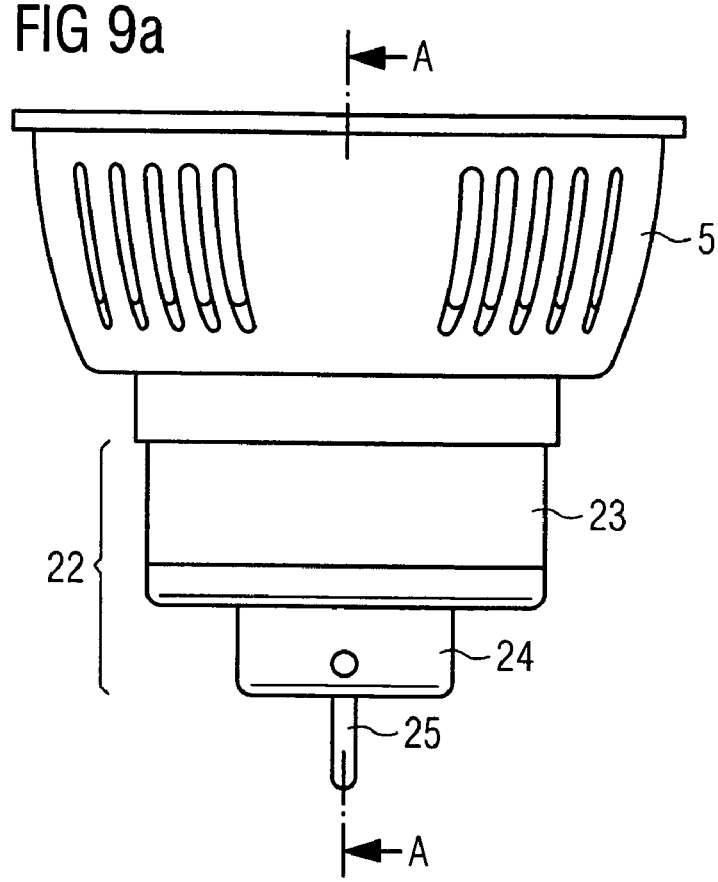
Figure 9B:
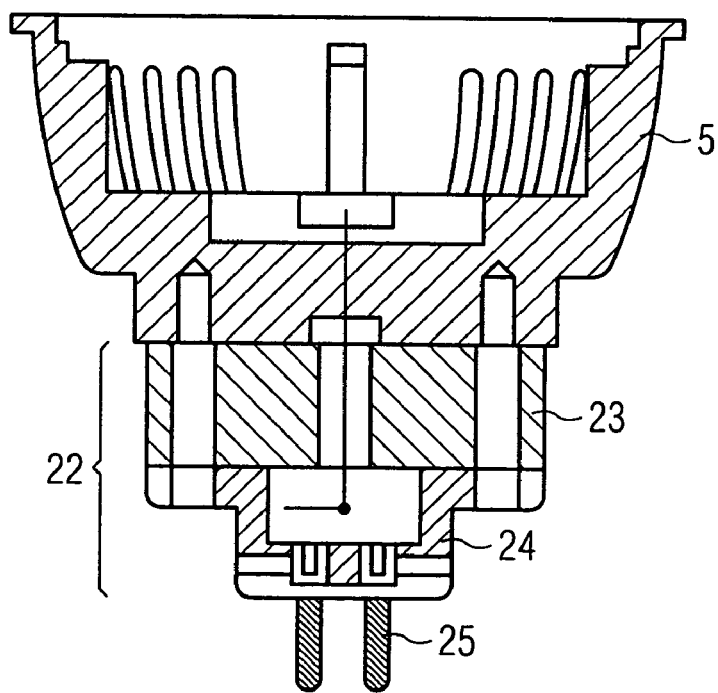

FIG. 1 shows an illumination unit in accordance with a first exemplary embodiment of the invention in an exploded illustration, FIG. 2 shows a view of the illumination unit in accordance with the first exemplary embodiment obliquely from above, FIG. 3 shows a view of the illumination unit in accordance with the first exemplary embodiment obliquely from below, FIG. 4 shows a further view of the illumination unit in accordance with the first exemplary embodiment obliquely from below, in which the housing is illustrated as transparent, FIG. 5 shows a plan view of the illumination unit in accordance with the first exemplary embodiment without the second optical element, FIG. 6 shows an illustration of the top side (left) and of the underside (right) of the second optical element in the case of the first exemplary embodiment of the invention, FIG. 7 shows an enlarged illustration of the underside of the second optical element in the case of the first exemplary embodiment of the invention, FIG. 8 shows a schematic graphical illustration of the LED light source with the first optical element and the second optical element in the case of a further exemplary embodiment of the invention, FIG. 9a shows a schematically illustrated side view of a further exemplary embodiment of the illumination unit according to the invention, and FIG. 9b shows a schematically illustrated cross section through the illumination unit illustrated in FIG. 9a.

DETAILED DESCRIPTION OF THE DRAWINGS

Identical or identically acting elements are provided with the same reference symbols in the figures.

The illumination unit in accordance with the first exemplary embodiment which is illustrated in various views in FIGS. 1 to 7 is explained in overall context below, reference being made to a specific figure only in the individual cases.

In the exemplary embodiment, an LED light source 3 together with an optical element 1 disposed downstream of the LED light source 3 is arranged on a carrier 16. The carrier 16 has an octagonal base area, for example, which can advantageously be positioned in a corresponding fitting form in a housing base fitting 18 of the housing 5 of the illumination unit. By way of example, the carrier 16, as illustrated in FIG. 4, can be fixedly connected to the housing base fitting 18 of the housing 5 by means of screws 17.

The housing 5 of the illumination unit is preferably a metal housing, which advantageously serves as a heat sink for the heat generated by the LED light source 3. The heat dissipation from the LED light source 3 can be improved by virtue of the housing 5 having lateral openings 6. Preferably, between 15 and 25 openings inclusive are provided in the housing 5, the openings 6 being for example slotted elongate cutouts in the side wall of the housing 5.

The LED light source 3 of the illumination unit contains at least one or preferably a plurality of LED chips. In one preferred embodiment, a plurality of LED chips are arranged on a common carrier, for example a circuit board. A plurality of LED chips can advantageously also be arranged on a carrier composed of a ceramic, in particular AlN, whereby the heat dissipation of the heat generated by the LED chips is improved.

The LED light source 3 can be in particular an LED light source which emits white light. The generation of white light can be realized for example by virtue of the fact that the LED light source 3 has arranged in it one LED chip or a plurality of LED chips emitting blue or ultraviolet light which is converted into white light by means of a luminescence conversion layer. For this purpose, the luminescence conversion layer contains luminescence conversion materials which convert at least part of the radiation emitted by the at least one LED chip towards a complementary longer wavelength.

By way of example, ultraviolet or blue radiation emitted by the LED chip can be converted in a complementary yellow spectral range, with the result that a superimposition of the complementary colours produces white light. Luminescence conversion materials suitable for this purpose are known for example from the document WO 97/50132 A1, the disclosure content of which in this regard is hereby incorporated by reference. In particular, garnets doped with rare earths, such as YAG:Ce, for example, are suitable as luminescence conversion material.

The luminescence conversion layer can be applied directly to the at least one LED chip or can alternatively be arranged in or on one of the optical elements 1, 2 disposed downstream of the LED light source 3.

As an alternative, the generation of white light by the LED light source 3 can also be realized by virtue of the fact that the LED light source 3 contains a plurality of LED chips emitting red, green and blue light which is superimposed by additive colour mixing to form white light.

For beam shaping of the light generated by the LED light source 3, the illumination unit contains a first optical element 1 and a second optical element 2.

The first optical element 1 is preferably an optical concentrator. The optical concentrator advantageously reduces the beam divergence of the radiation emitted by the LED light source 3. The optical concentrator 1 is for example a solid body composed of a plastic, in particular composed of polycarbonate. It has for example a planar radiation entrance area, a parabolically curved side wall, and also a convexly curved radiation exit area.

Disposed downstream of the first optical element 1 is a second optical element 2, which can be a lens, in particular. The second optical element 2 advantageously simultaneously functions as a housing covering for the housing 5 of the illumination unit. For fixing the second optical element 2 to the housing 5, the second optical element 2, as is illustrated in particular in FIG. 6, has fixing elements 11 which, as can be seen in FIGS. 2, 3 and 4, latch into the lateral openings 6 of the housing 5. By means of this snap-action connection, therefore, the second optical element 2 is advantageously fixed to the housing without the use of screws or adhesive and can thus be connected to the housing 5 or separated from the latter in a comparatively simple manner.

Furthermore, the housing 5 of the illumination unit contains an electronic control unit 4, which is formed for example from a plurality of electronic components 9 arranged on a circuit board 7. By means of the electronic control unit 4, for example the brightness of the LED light source 3 can be regulated by altering the current intensity of one or a plurality of LED chips or by connecting in or disconnecting one or a plurality of LED chips. As an alternative, for example the colour of the LED light source 3 can also be altered by connecting in or disconnecting one or a plurality of varicoloured LED chips contained in the LED light source 3.

The contour of the circuit board 7 for the electronic control unit 4 is preferably adapted to the form of the housing 5. By way of example, the housing 5 can be a round housing, the circuit board 7 being a round circuit board whose external diameter approximately matches the internal diameter of the housing 5. The circuit board 7 is preferably fixed in the housing 5 by means of at least one fixing element 12 formed at an inner wall of the housing 5. In this case, it is advantageous if the circuit board 7 is fixed in the housing 5 by means of a comparatively simple clamping connection, that is to say in particular not by means of a screw or adhesive bonding connection.

At an edge facing the inner wall of the housing, the circuit board 7 preferably has cutouts 10 through which the fixing elements 11 of the second optical element 2 can advantageously be inserted in order to be able to latch in the lateral openings 6 of the housing 5. In this way, the housing 5, the circuit board 7 and the second optical element 2 are mechanically connected to one another in a comparatively simple manner, which simplifies the handling of the illumination unit and in particular also the production in large numbers.

The circuit board 7 furthermore has a cutout 8 for transmission of the radiation emitted by the LED light source 3. By way of example, the first optical element 1 can be arranged in the housing 5 within or below the cutout 8 of the circuit board 7. In the plan view illustrated in FIG. 5, the convexly curved surface 13 of the first optical element 1 can be seen in the opening 8.

The electronic components 9 of the electronic control unit 4 are preferably arranged on an underside of the circuit board 7 facing the LED light source 3. By contrast, no electronic components are arranged on a top side of the circuit board 7 facing the second optical element 2, such that the electronic components 9 are advantageously not visible when viewing the illumination unit through the second optical element 2.

The second optical element 2, which is illustrated in FIG. 6 in a view obliquely from above (left) and in a view obliquely from below (right), has a convex curvature at a surface 13 remote from the LED light source 3. By contrast, a cushion-type surface structure is formed at a surface 14 of the second optical element 2 which faces the LED light source 3, said surface structure being shown in an enlarged illustration in FIG. 7. The cushion-type elevations at the surface 14 can have a hexagonal base contour, for example, like the cushion-type elevation 15 highlighted in colour in FIG. 7. The cushion-type elevations 15 are curved spherically or aspherically, for example elliptically, over the hexagonal base area. The cushion-type elevations 15 arranged at the radiation entrance area 14 of the second optical element 2 advantageously act as a diffuser for the light beams emerging from the first optical element 1, whereby the colour mixing of the light emitted by the LED light source 3 is improved. In particular, this results in an improved mixing of blue and yellow colour components which arise for example during the generation of white light by means of luminescence conversion, or of blue, red and green colour components which arise for example during the generation of white light by means of additive colour mixing. FIG. 8 illustrates the arrangement of the LED light source 3, of the first optical element 1 and of the second optical element 2 in the case of a further exemplary embodiment of the invention, the housing and the electronic control unit not being represented in order to simplify the illustration.

The LED light source 3 comprises at least one LED chip 21 arranged on a carrier 16. A luminescence conversion layer 19 is arranged on the LED chip 21 in order for example to convert blue light emitted by the LED chip at least partly into light having a longer wavelength of a complementary colour and to generate white light in this way. A first optical element 1 is arranged above the LED chip 21, said optical element being an optical concentrator. What is achieved by means of the optical concentrator 1 is that even light beams 20 emitted obliquely from the LED chip are reflected at the side walls of the concentrator and thus reach the radiation entrance area 14 of the second optical element 2. In particular, obliquely emitted light beams are not lost by emission in the lateral direction, for example by being absorbed at a wall of the housing.

The light beams 20 are refracted at the cushion-type elevations 15 of the second optical element 2, whereby the colour mixing of the white light generated by means of luminescence conversion is improved.

A further exemplary embodiment of the illumination unit is illustrated in FIG. 9a in a side view and in FIG. 9b in a cross section along the line A-A illustrated in FIG. 9a. In this exemplary embodiment, the housing 5 has a housing base fitting 22. The housing base fitting 22 can be mounted on the housing 5 or can be demounted from the housing 5 with little effort.

A heat sink 23 is advantageously integrated into the housing base fitting 22. The heat sink 23 contains a material having a good thermal conductivity for example a metal or a metal alloy, and thus improves the heat dissipation of the heat generated by the LED light source.

The housing base fitting 22 furthermore has two contact pins 25 for making electrical contact with the illumination device. Via the contact pins 25, the illumination device can be operated in particular with a low-voltage DC voltage, for example with a DC voltage of approximately 12 V. The contact pins 25 are led out from the housing base fitting 22 from an electrically insulating housing part 24 arranged at the underside of the housing base fitting 22 below the heat sink 23. In order to avoid an incorrect polarity during operation with a DC voltage, the illumination device can have a polarity reversal protection. The polarity reversal protection can be, in particular, an electronic polarity reversal protection, for example a diode that is reverse-biased in the case of incorrect polarity of the contact pins.

The housing base fitting 22 particularly preferably has the dimensions of a standardized housing base fitting for low-voltage luminous means. In particular, the housing base fitting 22 can have the dimensions of the plug-in base fitting of the GU 5.3 type that is known per se. In this case, the illumination device can be used in conventional luminaire systems in a simple manner; in particular, for example a conventional halogen low-voltage lamp having a housing base fitting of the GU 5.3 type can be replaced by the LED illumination unit according to the invention.

The illumination unit according to the invention is therefore distinguished by a compact housing enabling a good heat dissipation from the LED light source, and also a good beam quality, the comparatively simple mechanical connection of the components enabling simple handling and cost-effective manufacturing in large numbers.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. An illumination unit comprising:
    an LED light source,
    a first optical element disposed downstream of the LED light source in an emission direction,
    an electronic control unit arranged on a circuit board, and
    a second optical element disposed downstream of the first optical element,
    wherein the LED light source, the first optical element and the electronic control unit are arranged in a common housing covered by the second optical element,
    wherein the housing has lateral openings,
    wherein the second optical element is fixed in the lateral openings of the housing,
    wherein the second optical element has fixing elements which latch into the lateral openings of the housing, and
    wherein first cutouts for the fixing elements of the second optical element are formed at an edge of the circuit board which faces the housing.

2. The illumination unit according to claim 1, wherein the housing is a metal housing.

3. The illumination unit according to claim 1, wherein the first cutouts are formed at an inner wall of the housing.

4. The illumination unit according to claim 1, wherein the circuit board has a second cutout through which radiation emitted by the LED light source passes.

5. The illumination unit according to claim 4, wherein the second cutout is arranged in a center of the circuit board.

6. The illumination unit according to claim 1, wherein electronic components of the electronic control unit are arranged on a side of the circuit board which is remote from the second optical element.

7. The illumination unit according to claim 1, wherein at least one fixing element for the circuit board is formed at an inner wall of the housing.

8. The illumination unit according to claim 1, wherein the second optical element is a lens.

9. The illumination unit according to claim 8, wherein the lens has a convex curvature at a surface remote from the LED light source.

10. The illumination unit according to claim 8, wherein the lens has a surface structure composed of cushion-type elevations at a surface facing the LED light source.

11. The illumination unit according to claim 1, wherein the first optical element is an optical concentrator.

12. The illumination unit according to claim 1, wherein the housing has a housing base fitting into which a heat sink is integrated.

* * * * *